(12) United States Patent
Yokoi

(10) Patent No.: US 6,297,581 B1
(45) Date of Patent: *Oct. 2, 2001

(54) PIEZOELECTRIC ELEMENT AND ELECTRONIC COMPONENT INCLUDING SAME

(75) Inventor: Yuko Yokoi, Toyama-ken (JP)

(73) Assignee: Murata Manufacturing Co., Ltd., Kyoto (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/138,688

(22) Filed: Aug. 24, 1998

(30) Foreign Application Priority Data

Sep. 11, 1997 (JP) .................................... 9-267961

(51) Int. Cl.[7] .................................... H01L 41/08
(52) U.S. Cl. .................................... 310/368; 310/348
(58) Field of Search .................................... 310/367, 368, 310/345, 348, 363

(56) References Cited

U.S. PATENT DOCUMENTS

| | | | |
|---|---|---|---|
| 4,454,444 | * 6/1984 | Fujiwara et al. | 310/360 |
| 4,455,502 | * 6/1984 | Nakatani | 310/368 |
| 4,455,503 | * 6/1984 | Nakatani | 310/368 |
| 5,859,488 | * 1/1999 | Okeshi et al. | 310/368 |
| 5,973,442 | * 10/1999 | Irie | 310/366 |
| 6,005,330 | * 12/1999 | Okeshi et al. | 310/348 |

FOREIGN PATENT DOCUMENTS 2-224515   9/1990   (JP) .................................... H03H/9/17

OTHER PUBLICATIONS

Tietz et al., Non–Destructive Testing of Green Ceramic Materials, NDT.net, vol. 3, No. 11 (Nov. 1998).*

* cited by examiner

Primary Examiner—Thomas M. Dougherty

(57) ABSTRACT

A piezoelectric element vibrating in a longitudinal vibration mode includes external electrodes which are provided on front and back major surfaces of a piezoelectric substrate. Conductive sections are fixed onto nodal portions of the piezoelectric element on one of the major surfaces of the piezoelectric substrate. The piezoelectric element is constructed such that a relationship T1/T is set at about 0.5 or less and a relationship L1/L is set at about 0.2 or less, where a thickness and a length of the piezoelectric element are T and L, respectively, and a thickness and a length of the support sections are T1 and L1, respectively.

4 Claims, 10 Drawing Sheets

PIEZOELECTRIC ELEMENT AND ELECTRONIC COMPONENT INCLUDING SAME

BACKGROUND OF THE INVENTION

1. Field of the Invention

The present invention relates to a piezoelectric element for use in an oscillator and a filter that vibrates in a longitudinal vibration mode, and an electronic component using the piezoelectric element.

2. Description of the Related Art

In a well-known piezoelectric element vibrated in a longitudinal vibration mode, as disclosed in Japanese Unexamined Patent Publication No. 2-224515, an input electrode and an output electrode, which are separated by a linear groove extending in the longitudinal direction of the piezoelectric element, are provided on one major surface of a piezoelectric substrate, and a common electrode is disposed on the other major surface of the piezoelectric substrate. The input and output electrodes each include a support section made of conductive rubber which functions as an electrical contact for making an electrical connection with an outer conductor.

In the above-described piezoelectric element including the fixed support section, however, the longitudinal vibration is sometimes hindered due to the particular dimensions and material of the support section which deteriorates the resonance properties of the piezoelectric element.

As a result of various studies of this problem, it has been found that the thickness, length, and elastic coefficient (Young's modulus) of the support section are closely related to a resonance resistance and that resonance resistance is a cause of deterioration of resonant properties.

SUMMARY OF THE INVENTION

To overcome the problems described above, the preferred embodiments of the present invention provide a piezoelectric element that prevents interference with longitudinal vibration and eliminates deterioration of the resonance properties.

The preferred embodiments of the present invention also provide a electronic component having excellent electrical characteristics and including a piezoelectric element that prevents interference with longitudinal vibration and eliminates deterioration of the resonance properties.

According to a preferred embodiment of the present invention, there is provided a piezoelectric element vibrating in a longitudinal vibration mode and including a piezoelectric substrate; a pair of external electrodes provided on front and back major surfaces of the piezoelectric substrate, respectively; and a conductive support section disposed on one of the pair of external electrodes and located at a nodal portion of the piezoelectric substrate; wherein the piezoelectric element satisfies the following condition: $T1/T<0.5$ where T represents a thickness of the piezoelectric element and T1 represents a thickness of the support section.

According to another preferred embodiment of the present invention, there is provided a piezoelectric element vibrating in a longitudinal vibration mode and including a piezoelectric substrate; a pair of external electrodes respectively provided on front and back major surfaces of the piezoelectric substrate; and a conductive support section disposed on one of the pair of external electrodes and located at a nodal portion of the piezoelectric substrate; wherein the piezoelectric element satisfies the following condition: $L1/L<0.2$ where L represents the length of the piezoelectric element and L1 represents the length of the support section.

According to a further preferred embodiment of the present invention, there is provided a piezoelectric element vibrating in a longitudinal vibration mode and including a piezoelectric substrate; a pair of external electrodes respectively provided on front and back major surfaces of the piezoelectric substrate; and a conductive support section disposed on one of the pair of external electrodes and located at a nodal portion of the piezoelectric substrate; wherein the piezoelectric element satisfies the following conditions: $T1/T<0.5$ and $L1/L<0.2$ where T represents a thickness of the piezoelectric element, T1 represents a thickness of the support section, L represents a length of the piezoelectric element, and L1 represents a length of the support section.

The above-mentioned features and relationships set forth in the conditions provide a significant reduction in resonance resistance, prevent interference with the longitudinal vibration, and provide a piezoelectric element having excellent resonance performance and electrical properties which are hardly affected by the problems described with relation to the prior art devices and disadvantages.

When the piezoelectric element is fixedly connected to an outer conductor (e.g., a pattern electrode of a mounting substrate), the support section functions as a spacer which defines a vibration space between the piezoelectric element and the outer conductor, and functions as a conductive member for electrically connecting the electrode of the piezoelectric element and the outer conductor. In this case, it is preferable to set the thickness T1 and the length L1 of the support section as large as possible in order to enhance stability of the piezoelectric element and to prevent vibration failure and insulation failure. Since the thickness T1 and the length L1 are limited as mentioned above, however, it is preferable that the thickness T1 and the length L1 be as large as possible as long as they do not interfere with the vibration characteristics.

In addition to the dimensions of the support section, a material which is used to form the support section and a Young's modulus of such material has a great influence on the resonance resistance. Therefore, it is preferable to make the support section of a material having a Young's modulus of about $10^9$ N/m² or more. The support section made of such a material having a high Young's modulus vibrates according to the vibration of the piezoelectric element and does not suppress the longitudinal vibration of the piezoelectric element, whereby the resonance resistance is significantly reduced.

A electronic component is provided by mounting the piezoelectric element according to preferred embodiments described above on a pattern electrode disposed on an upper surface of an insulating mounting substrate. That is, a major surface of the piezoelectric element where the support section is fixed is disposed opposite to the surface of the mounting substrate having pattern electrodes disposed thereon, the support section is fixedly connected to one pattern electrode of the mounting substrate, and an electrode on the other major surface of the piezoelectric element is connected to another pattern electrode of the mounting substrate via a conductive wire. A cap may be fixedly bonded to the mounting substrate so that the cap covers the piezoelectric element.

In such an electronic component, it is preferable to make the mounting substrate of a material having a Young's modulus of about $10^{11}$ N/m² or less. That is, when the Young's modulus of the mounting substrate is preferably about $10^{11}$ N/m$^2$ or less, the vibration of the piezoelectric element is transmitted to the mounting substrate via the support section, while a vibration-absorbing effect of the mounting substrate makes it difficult to return a reflected wave to the piezoelectric element. As a result, a piezoelectric component having excellent properties is achieved.

Further objects, features and advantages of the present invention will become apparent from the following description of preferred embodiments with reference to the attached drawings.

DETAILED DESCRIPTION OF PREFERRED EMBODIMENTS

Figure 1:
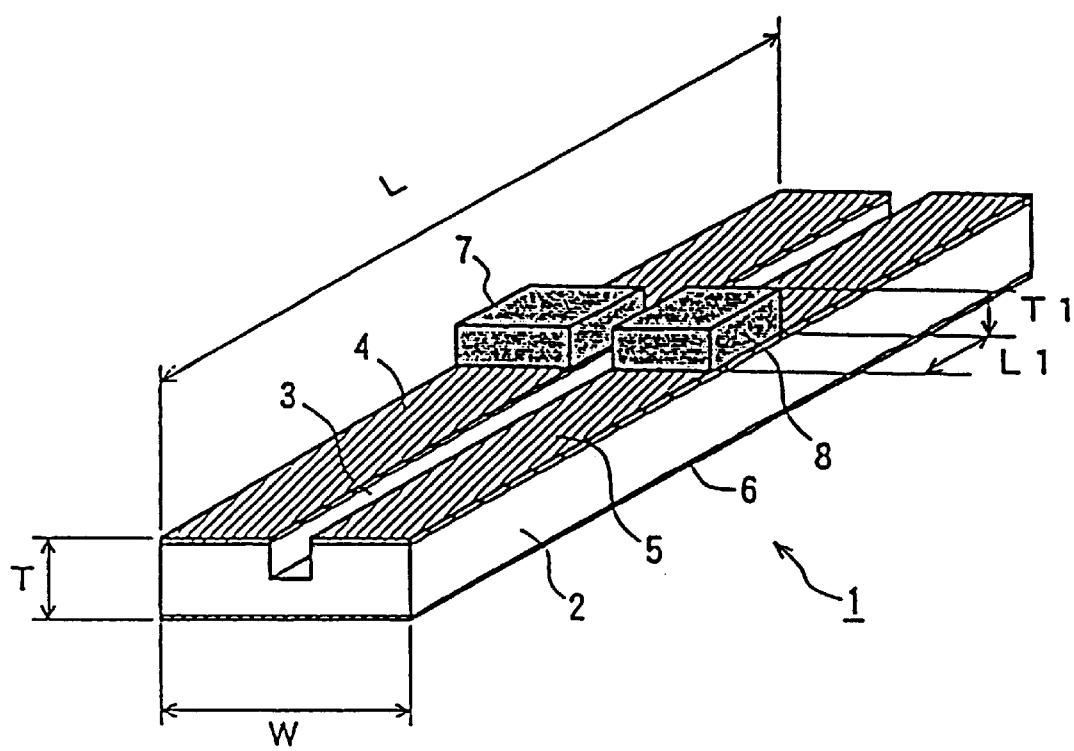
FIG. 1 is a perspective view of a piezoelectric element according to a preferred embodiment of the present invention.

FIG. 1 shows a piezoelectric element 1 which is constructed to vibrate in a longitudinal vibration mode according to a preferred embodiment of the present invention. Referring to FIG. 1, a piezoelectric ceramic substrate 2 preferably having a substantially rectangular shape is provided with first and second external electrodes 4 and 5, which are separated by a linear groove 3 extending in the longitudinal direction, on one major surface of the substrate 2, and a third external electrode 6 preferably disposed to cover all of the other major surface of the substrate 2. Conductive support sections 7 and 8 are fixed on nodal portions of the first and second electrodes 4 and 5, respectively. The support sections 7 and 8 preferably have the same thickness T1 and the same length L1.

In this preferred embodiment, the groove 3 preferably extends in a direction that is offset from a widthwise center of the piezoelectric element 1 in order to limit the spurious response which is caused by width vibration and thickness vibration.

Figure 2:
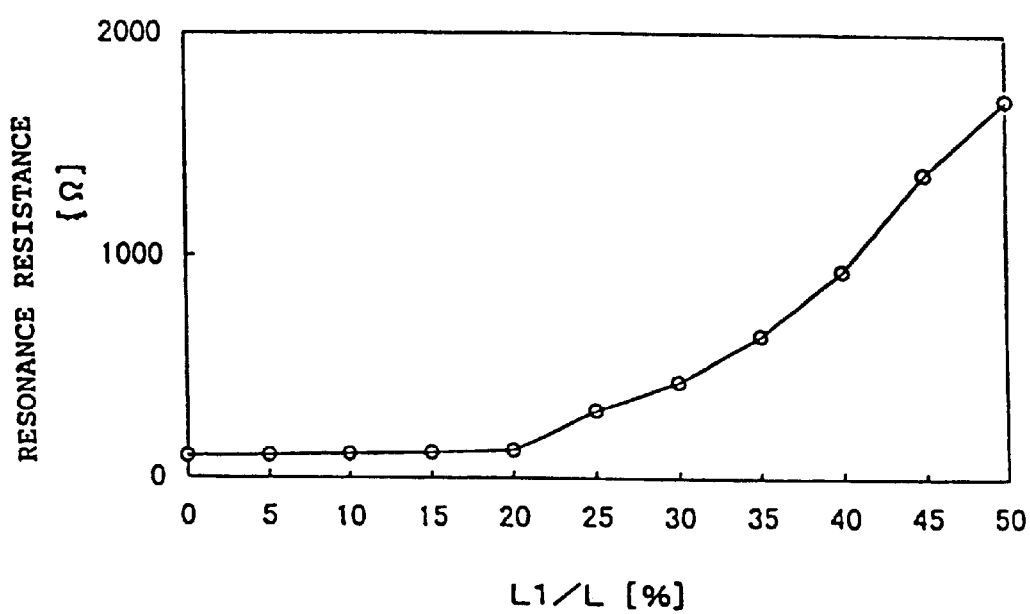
FIG. 2 is a graph showing the relationship between the resonance resistance of the piezoelectric element of FIG. 1 and L1/L.
Figure 3:
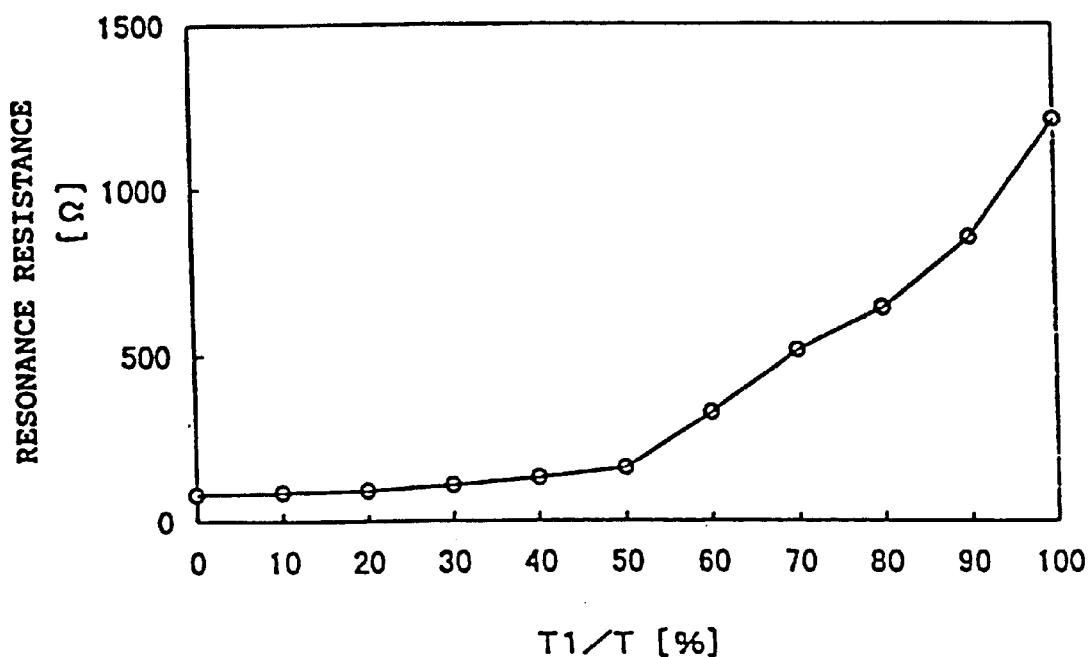
FIG. 3 is a graph showing the relationship between the resonance resistance of the piezoelectric element of FIG. 1 and T1/T.

In an example of preferred embodiments of the present invention, resonance resistance was measured in a device in which a thickness T, a length L, and a width W of the piezoelectric element 1 described above were respectively set to the following approximate values: 0.38 mm, 4.1 mm, and 0.9 mm; and a thickness and a length of the support sections 7 and 8 were represented by T1 and L1, the resonance resistance varied according to L1/L and T1/T, as shown in FIGS. 2 and 3.

The ratio T1/T and the Young's modulus of the support sections 7 and 8 were set at about 0.5 and about $10^9$ N/m$^2$ in the example shown in FIG. 2, and L1/L and the Young's modulus were set at about 0.2 and about $10^9$ N/m$^2$ in the example shown in FIG. 3.

FIGS. 2 and 3 reveal that the resonance resistance rapidly increases when L1/L exceeds about 0.2 and when T1/T exceeds about 0.5. This interferes with the longitudinal vibration, and causes to deteriorate the properties of the piezoelectric element 1. Therefore, it is preferable to set a ratio T1/T and a ratio L1/L at the following values, respectively:

$$T1/T<0.5$$

$$L1/L<0.2$$

Figure 4:
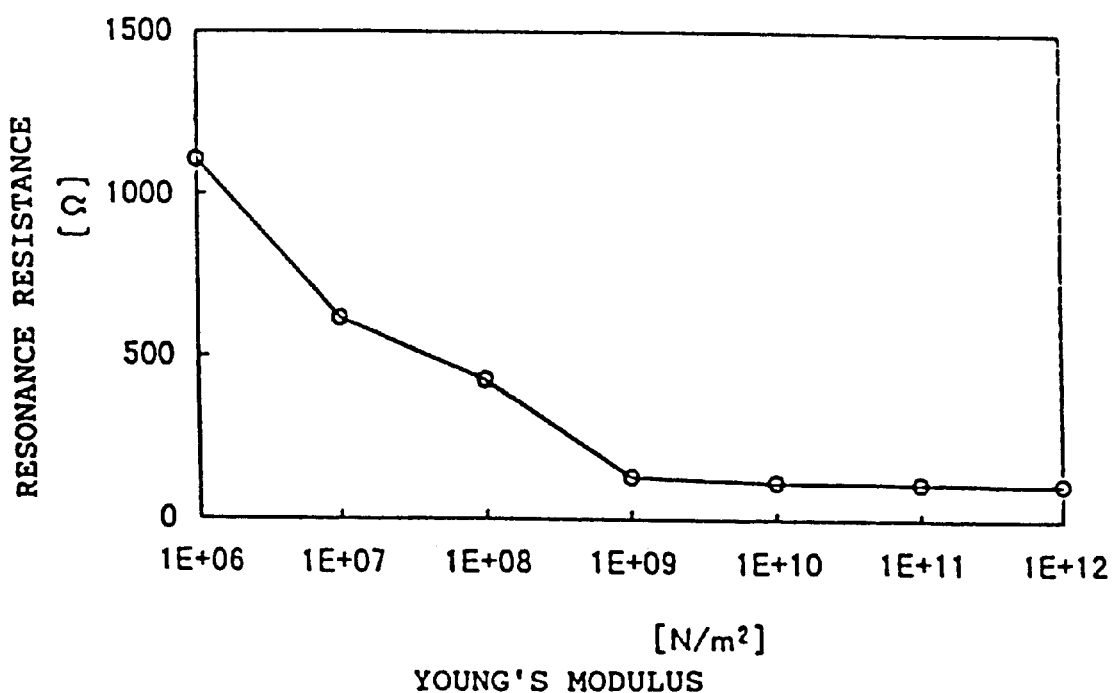
FIG. 4 is a graph showing the relationship between the resonance resistance of the piezoelectric element of FIG. 1 and the Young's modulus of a support section.

It was also discovered that the relationship between the Young's modulus of the support sections 7 and 8 and the resonance resistance is such that the resonance resistance rapidly increased when the Young's modulus is below about $10^9$ N/m$^2$, as shown in FIG. 4.

Figure 5:
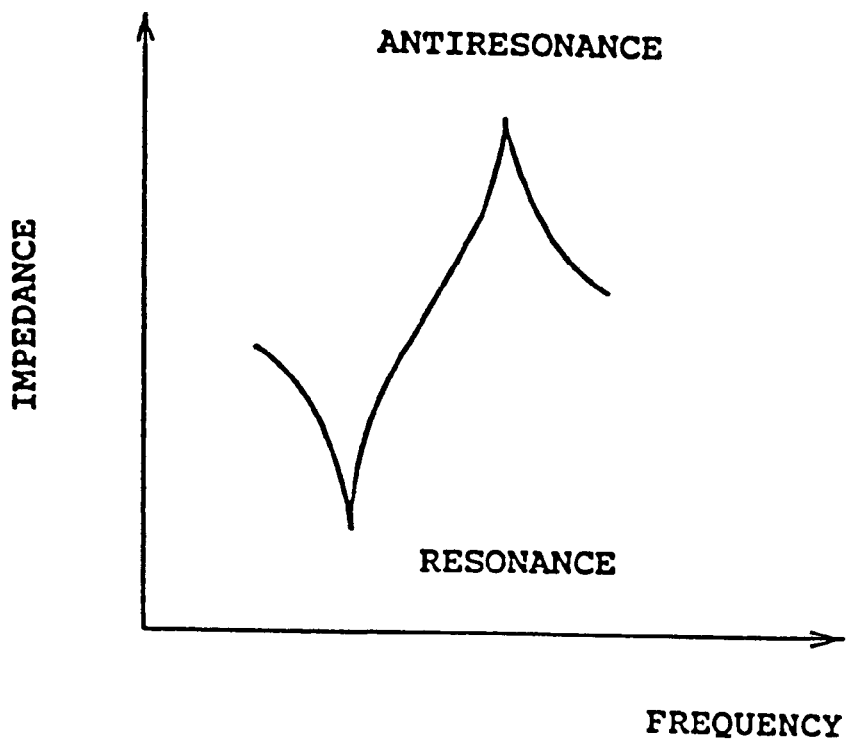
FIG. 5 is an impedance characteristic curve in a case in which the Young's modulus of the support section is $10^9$ N/m$^2$ or more.
Figure 6:
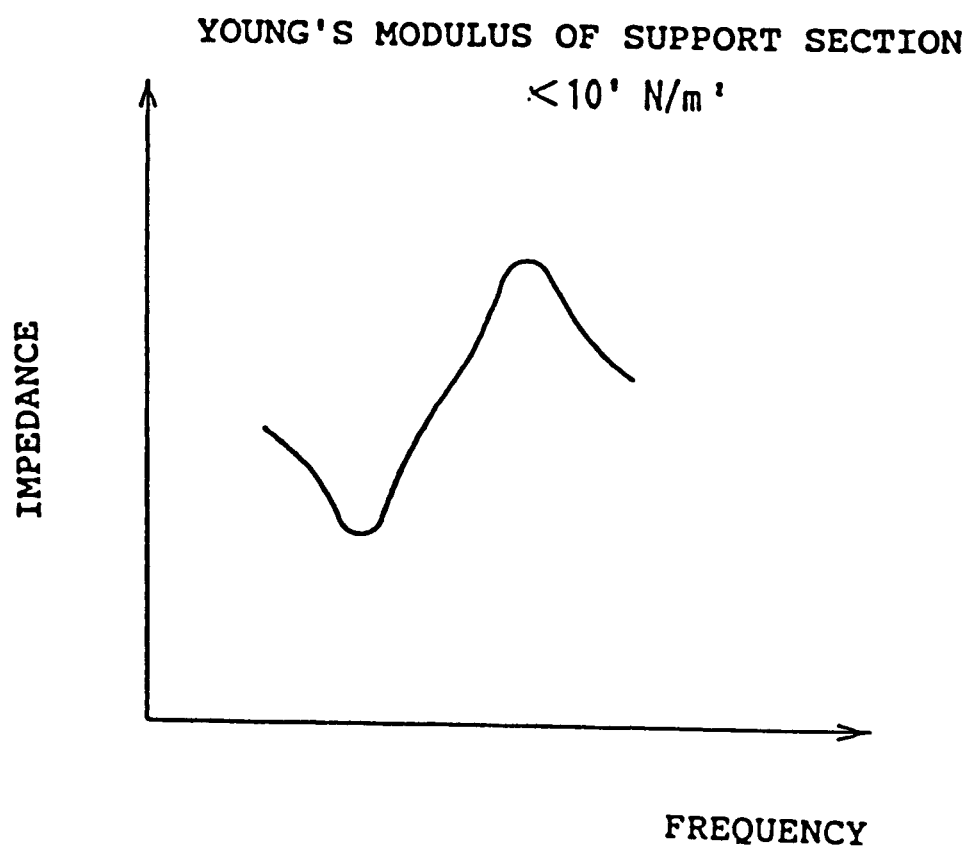
FIG. 6 is an impedance characteristic curve in a case in which the Young's modulus of the support section is less than $10^9$ N/m$^2$.

FIG. 5 shows the impedance characteristic of the piezoelectric element 1 when the Young's modulus of the support sections 7 and 8 is about $10^9$ N/m$^2$ or more, and FIG. 6 shows the impedance characteristic when the Young's modulus is less than about $10^9$ N/m$^2$.

When the Young's modulus is about $10^9$ N/m$^2$ or more, as shown in FIG. 5, the support sections 7 and 8 move in response to the longitudinal vibration of the piezoelectric element 1, and the vibration of the piezoelectric element 1 is resistant to interference, that is, a desirable impedance characteristic can be obtained. On the other hand, when the Young's modulus is less than about $10^9$ N/m$^2$, the support sections 7 and 8 do not move in response to the longitudinal vibration of the piezoelectric element 1, and the support sections 7 and 8 absorb the longitudinal vibration, as shown in FIG. 6, which produces only a damping effect. Therefore, the response which is a difference in impedance between a resonance point and an antiresonance point is impaired.

Accordingly, it is preferable that the support sections 7 and 8 be made of a material having a Young's modulus of about $10^9$ N/m$^2$ or more. In this preferred embodiment, the support sections 7 and 8 are preferably made of an epoxy conductive adhesive having a Young's modulus of about $10^9$ N/m$^2$ or more.

Figure 7:
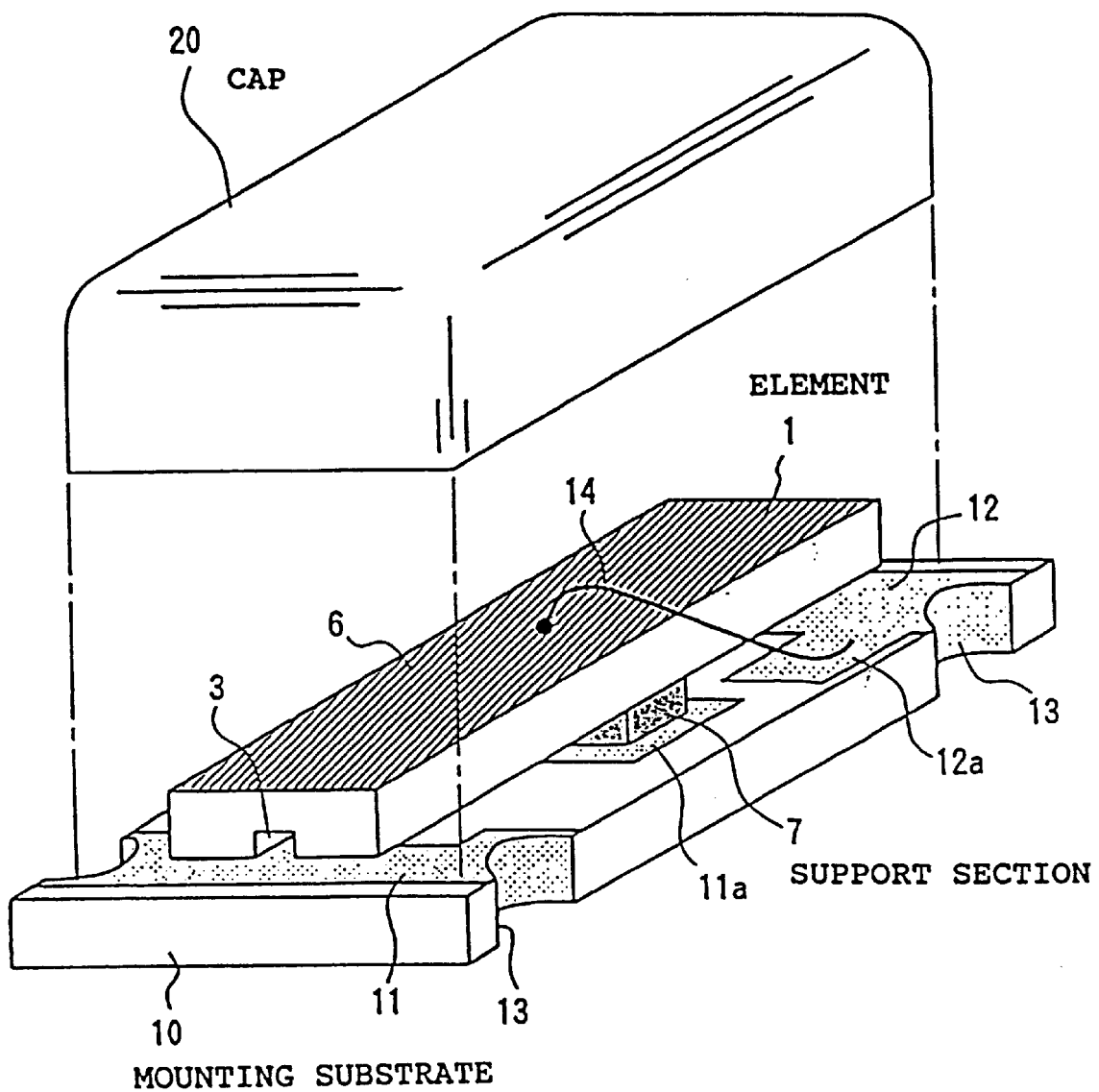
FIG. 7 is a perspective view of one example of a surface-mount oscillator using the piezoelectric element shown in FIG. 1.

FIG. 7 shows an example of a surface-mount oscillator utilizing the piezoelectric element 1 shown in FIG. 1.

This oscillator includes a mounting substrate 10 and a cap 20 as well as the piezoelectric element 1. The mounting substrate 10 is preferably a substantially rectangular insulating thin plate made of alumina ceramics, glass ceramics, glass fabric based epoxy resin, or other suitable material. On the upper surface of the mounting substrate 10, two pattern electrodes 11 and 12 on the input and output sides are preferably provided via a suitable process such as sputtering, evaporation, or printing. The pattern electrodes 11 and 12 extend to the back side of the mounting substrate 10 through notches 13 provided at the side edges of the mounting substrate 10.

The piezoelectric element 1 is mounted so that the support sections 7 and 8 are located opposite to the upper surface of the mounting substrate 10. That is, the support sections 7 and 8 are bonded to a connecting section 11a of the pattern electrode 11 on the input side (or the output side) preferably via conductive adhesive (not shown), so that the external electrodes 4 and 5 are electrically connected to the pattern electrode 11. At this time, since the thickness of the support sections 7 and 8 define a predetermined space between both lengthwise ends of the piezoelectric element 1, which function as vibrating sections, and the mounting substrate 10, there is no fear that vibration will be interfered with by contact between the vibrating sections of the piezoelectric element 1 and the mounting substrate 10. There is also no concern that insulation failure will be caused by contact between the external electrodes 4 and 5 and the pattern electrode 12 that are different in potential.

After bonding the piezoelectric element 1, the third external electrode 6 of the piezoelectric element 1 and a connecting section 12a of the pattern electrode 12 on the output side (or the input side) are connected via a conductive wire 14. This wire 14 can be easily connected by a known wire bonding method.

Figure 8:
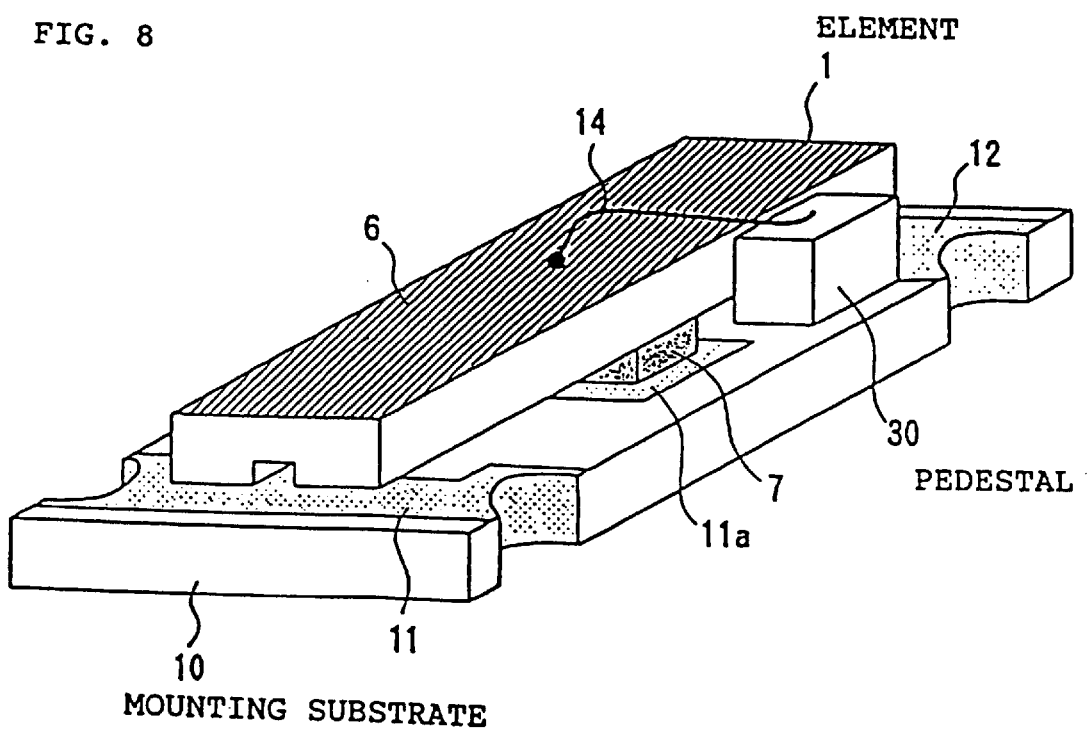
FIG. 8 is a perspective view of another example of the surface-mount oscillator using the piezoelectric element shown in FIG. 1.

When the third external electrode 6 of the piezoelectric element 1 and the output-side pattern electrode 12 are connected via the conductive wire 14, a conductive pedestal 30 may be fixed on the connecting section 12a of the pattern electrode 12 and connected to the third external electrode 6 via the conductive wire 14, as shown in FIG. 8. In this case, the upper surface of the pedestal 30 and the upper surface of the piezoelectric element 1 can be made almost equal in height by setting the thickness of the pedestal 30 to be substantially equivalent to the sum of the thicknesses of the piezoelectric element 1 and the support section 7 or 8, which facilitates a wire bonding operation.

After the piezoelectric element 1 is bonded and the wire 14 is connected, the cap 20 is bonded onto the mounting substrate 10 via insulating adhesive (not shown) so that the cap covers and seals the piezoelectric element 1, whereby a surface-mount oscillator is completed.

In the oscillator having the construction described above, it is preferable that the mounting substrate 10 be made of a material having a Young's modulus of about $10^{11}$ N/m$^2$ or less.

Figure 9:
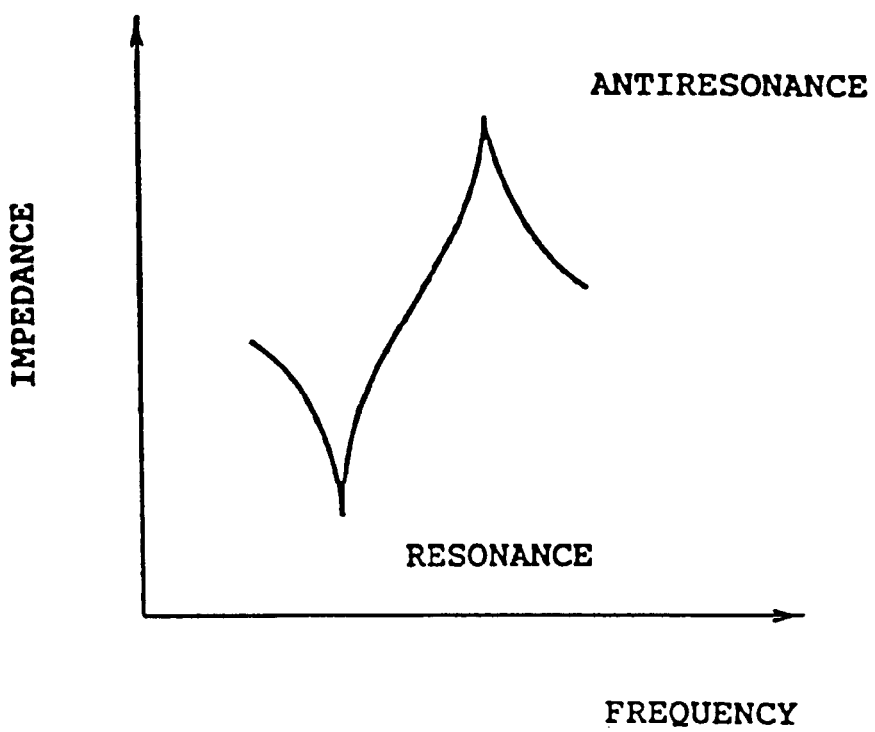
FIG. 9 is an impedance characteristic curve in a case in which the Young's modulus of a mounting substrate is $10^{11}$ N/m$^2$ or less.
Figure 10:
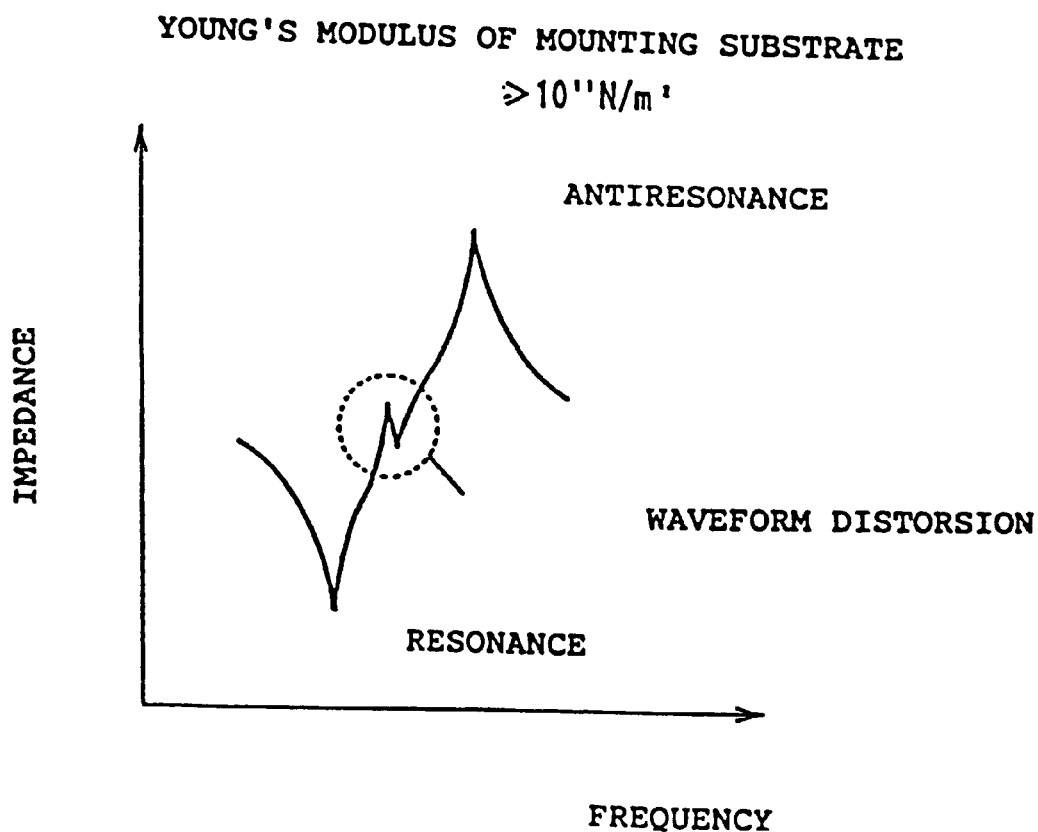
FIG. 10 is an impedance characteristic curve in a case in which the Young's modulus of the mounting substrate is more than $10^{11}$ N/m$^2$.

FIG. 9 shows an impedance characteristic of the oscillator when the Young's modulus of the mounting substrate 10 is about $10^{11}$ N/m$^2$ or less, and FIG. 10 shows an impedance characteristic of the oscillator when the Young's modulus is more than about $10^{11}$ N/m$^2$.

While the vibration of the piezoelectric element 1 is transmitted to the mounting substrate 10 via the support sections 7 and 8 when the Young's modulus is about $10^{11}$ N/m$^2$ or less, the absorption effect of the mounting substrate 10 makes it difficult to return a reflected wave to the piezoelectric element 1. In short, vibration leakage is prevented, and an excellent impedance characteristic shown in FIG. 9 can be obtained. On the other hand, when the Young's modulus is more than about $10^{11}$ N/m$^2$, the vibration of the piezoelectric element 1 is reflected by the mounting substrate 10 via the support sections 7 and 8, and is hindered in the state in which bending vibration is superimposed on the longitudinal vibration. This causes waveform distortion in the impedance characteristic, as shown in FIG. 10.

While the electrode on the back of the piezoelectric element is divided into a plurality of electrodes by forming a groove in order to limit the spurious response in the above-described preferred embodiment, such a groove is not always necessary, that is, a single electrode may be provided on each side of the piezoelectric element.

The piezoelectric element of preferred embodiments of the present invention may be used not only as an oscillator, but also as a filter. When the piezoelectric element is used as a filter, the electrode on one major surface is divided via a groove into a plurality of electrodes having different potentials. The number of grooves for the division of the electrode may be one or more.

Furthermore, it is not always necessary to provide one support section for each electrode. A plurality of support sections which are spaced in the longitudinal direction of the piezoelectric element may be used. In this case, the support section length L1 refers to a distance between the outer sides of the spaced support sections.

Still furthermore, the support section does not always have to be entirely made of a conductive material. The support section may be constructed such that only part of the support section is made of a conductive material and a remainder of the support section can be made of an insulating material.

The support section may be connected to the outer conductor by being pressed against the outer conductor via a spring terminal or the like, besides being bonded with conductive adhesive as in the above preferred embodiment. In order to obtain stability and contact reliability, however, bonding with the conductive adhesive or the like is more preferable. In addition, when the support section itself is made of an uncured conductive adhesive, the support section may be directly bonded to the outer conductor.

While the present invention has been described with reference to what is presently considered to be preferred embodiments thereof, it is to be understood that the invention is not limited to the disclosed preferred embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A piezoelectric element, comprising:

a piezoelectric substrate vibrating in a longitudinal vibration mode and having a nodal portion at which substantially no vibration occurs located at an approximate center along the length of the piezoelectric substrate;

a pair of external electrodes respectively provided on front and back major surfaces of the piezoelectric substrate; and a conductive support section made of a material having a Young's modulus of at least about $10^9$ N/m$^2$, disposed on one of said external electrodes and located at said nodal portion of said piezoelectric substrate at said approximate center along the length of the piezoelectric substrate; wherein said piezoelectric element satisfies the following condition:

$$T1/T<0.5$$

where T represents a thickness of said piezoelectric element and T1 represents a thickness of said support section.

2. A piezoelectric element, comprising:

a piezoelectric substrate vibrating in a longitudinal vibration mode and having a nodal portion at which substantially no vibration occurs located at an approximate center along the length of the piezoelectric substrate;

a pair of external electrodes respectively provided on front and back major surfaces of the piezoelectric substrate; and a conductive support section made of a material having a Young's modulus of at least about $10^9$ N/m$^2$, disposed on one of said external electrodes and located at said nodal portion of said piezoelectric substrate at said approximate center along the length of the piezoelectric substrate; wherein said piezoelectric element satisfies the following condition:

$$L1/L < 0.2$$

where L represents a length of said piezoelectric element and L1 represents a length of said support section.

3. A piezoelectric element, comprising:

a piezoelectric substrate vibrating in a longitudinal vibration mode and having a nodal portion at which substantially no vibration occurs located at an approximate center along the length of the piezoelectric substrate;

a pair of external electrodes respectively provided on front and back major surfaces of the piezoelectric substrate; and a conductive support section made of a material having a Young's modulus of at least about $10^9$ N/m$^2$, disposed on one of said external electrodes and located at said nodal portion of said piezoelectric substrate at said approximate center along the length of the piezoelectric substrate; wherein said piezoelectric element satisfies the following conditions:

$$T1/T < 0.5 \text{ and } L1/L < 0.2$$

where T represents a thickness of said piezoelectric element, T1 represents a thickness of said support section, L represents a length of said piezoelectric element, and L1 represents a length of said support section.

4. An electronic component, comprising:

a piezoelectric element including:

a piezoelectric substrate vibrating in a longitudinal vibration mode and having a nodal portion at which substantially no vibration occurs located at an approximate center along the length of the piezoelectric substrate;

a pair of external electrodes respectively provided on front and back major surfaces of the piezoelectric substrate; and a conductive support section made of a material having a Young's modulus of at least about $10^9$ N/m$^2$, disposed on one of said external electrodes and located at said nodal portion of said piezoelectric substrate at said approximate center along the length of the piezoelectric substrate; wherein said piezoelectric element satisfies the following condition:

$$T1/T < 0.5$$

where T represents a thickness of said piezoelectric element and T1 represents a thickness of said support section, an insulating mounting substrate including pattern electrodes disposed thereon and arranged to support said piezoelectric element such that said piezoelectric element is connected to one of the pattern electrodes provided on said insulating mounting substrate; wherein said support section is fixedly connected to said pattern electrode;

said external electrode of another major surface of said piezoelectric element is connected to the other pattern electrode of said insulating mounting substrate via a conductive wire; and said insulating mounting substrate is made of a material having a Young's modulus of about $10^{11}$ N/m$^2$ or less.

* * * * *